United States Patent [19]
Nomura et al.

[11] Patent Number: 6,011,611
[45] Date of Patent: Jan. 4, 2000

[54] METHOD OF MEASURING ABERRATION OF PROJECTION OPTICS

[75] Inventors: Hiroshi Nomura, Kawasaki; Takashi Sato, Fujisawa; Takuya Kono, Urawa, all of Japan; Junichiro Iba, Mohigan Lake, N.Y.

[73] Assignee: Kabushiki Kaisha Toshiba, Kawasaki, Japan

[21] Appl. No.: 09/186,368

[22] Filed: Nov. 5, 1998

[30] Foreign Application Priority Data

Nov. 7, 1997 [JP] Japan .................................. 9-305917

[51] Int. Cl.$^7$ ........................... G03B 27/54; G03B 27/42; G03C 5/00
[52] U.S. Cl. ................... 355/67; 355/53; 430/30
[58] Field of Search .................. 355/36, 67, 77, 355/50, 55; 430/5, 20, 22, 30, 296

[56] References Cited

U.S. PATENT DOCUMENTS

| | | | |
|---|---|---|---|
| 5,636,002 | 6/1997 | Garofalo | 355/53 |
| 5,667,923 | 9/1997 | Kanata | 430/30 |
| 5,698,346 | 12/1997 | Sugawara | 430/5 |
| 5,792,581 | 8/1998 | Ohnuma | 430/30 |
| 5,825,647 | 10/1998 | Tsudaka | 364/167.03 |

OTHER PUBLICATIONS

R. M. Silver et al., "Overlay measurements and standards", SPIE, vol. 2439, pp. 262–272, (1995).

H. Nomura et al., "Overlay Error due to Lens Coma and Asymmetric Illumination Dependence on Pattern Feature", SPIE, vol. 3332, 12 pages, (1998).

T. Saito et al., "Effect of Variable Sigma Aperture on Lens Distortion and its Pattern Size Dependence", SPIE, vol. 2725, pp. 414–423, (1996).

T. Saito et al., "Overlay Error of Fine Patterns by Lens Aberration using Modified Illumination", SPIE, vol. 3051, pp. 686–696, (1997).

J. P. Kirk, "Astigmatism and field curvature from pin–bars", SPIE, vol. 1463, pp. 282–291, (1991).

*Primary Examiner*—Eddie C. Lee
*Assistant Examiner*—Hung Henry Nguyen
*Attorney, Agent, or Firm*—Finnegan, Henderson, Farabow, Garrett & Dunner, L.L.P.

[57] ABSTRACT

The method of measuring the aberration of the projection optics, according to the present invention includes the following steps. In the first step, the first mask pattern including the first pattern in which a line and space pattern is arranged on a photomask to be linearly symmetrical, and the second pattern in which line patterns having a large line width are arranged on outer sides of the first pattern, to be linearly symmetrical, is transferred on a substrate. In the second step, the second mask pattern in which a patter designed to leave a part of the first pattern and a pattern designed to leave the entire second pattern are arranged to be linearly symmetrical, is transferred on the same substrate, so as to superimpose it on the transferred first pattern. In the third step, the position of the transferred pattern of the second pattern, and the predetermined position of the pattern section of the transferred pattern of the first pattern, which is left in the second step are detected. Thus, from the difference between these positions detected in the third step, the aberration of the projecting optics which is situated between the mask pattern of the photomask and the substrate is measured.

19 Claims, 13 Drawing Sheets

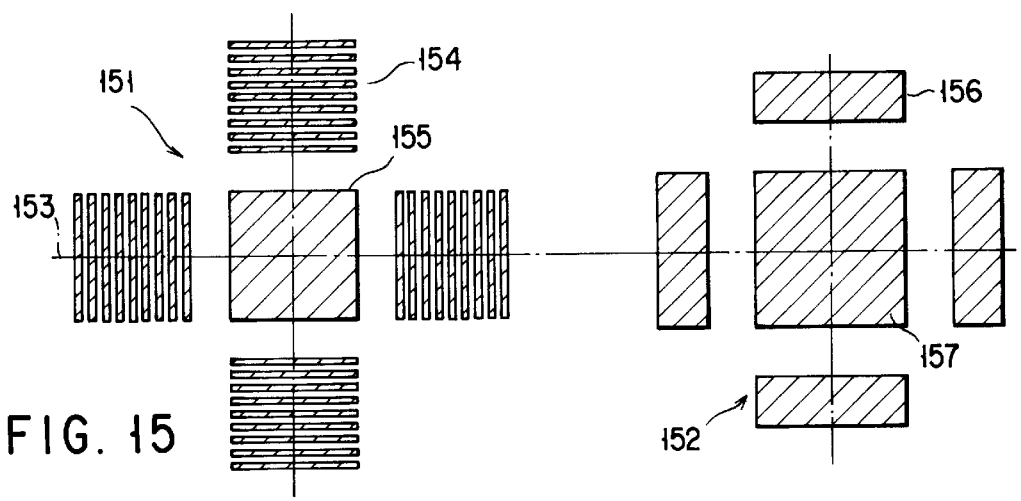
FIG. 15
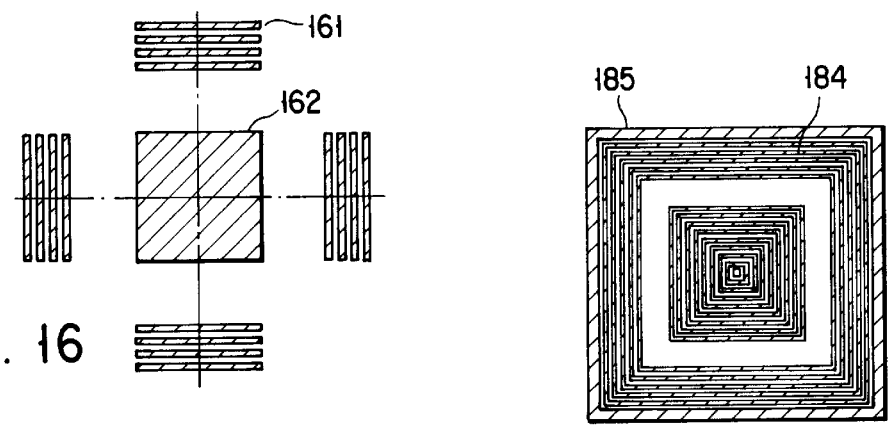
FIG. 16
FIG. 18
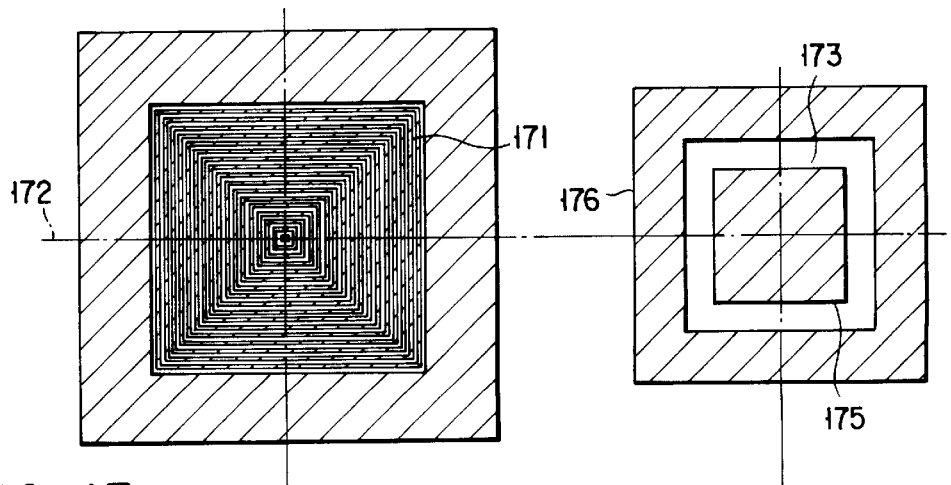
FIG. 17

METHOD OF MEASURING ABERRATION OF PROJECTION OPTICS

BACKGROUND OF THE INVENTION

The present invention relates to a method of measuring aberration of a projection optics, and more specifically to a method of measuring aberration of a projection optics, which is designed to measure the aberration by measuring transfer patterns in a photolithography step.

In general, a projection optics is built in various types of devices, for example, an exposure tool, and used in a lithography step in a semiconductor manufacturing process. In these operations, the aberration of the projection lens used, may cause an adverse effect against the acquisition of an accurate projection image.

The deterioration of a projection image is exhibited as, for example, the degradation of its resist image. More specifically, in a lithography step for a trench-type DRAM, a pattern may be transferred asymmetrically when forming a twice hall pattern from a fine deep trench pattern via a projection optics.

The aberration which causes the degradation of a resist image, is presently described while citing "5 aberrations of Suidel", that is, the spherical aberration, coma, astigmatism, field curvature and distortion.

The spherical aberration is the phenomenon that patterns having object planes of difference sizes cause a difference in the position of the transfer image on an image plane. The astigmatism is the phenomenon that the best focus is displaced due to the difference of patterns in their direction. The comma is the phenomenon that a resist profile symmetry is degraded and a placement error is enhanced, which depend on the pattern size, density and feature. The field curvature is the phenomenon that best focuses are displaced from the desired positions in an image plane or an exposure field, the displacements of the best focuses being distributed in a manner.

The word "distortion" means that the image transferred is deformed and displaced from a desired position in an image plane or an exposure field. For the measurement of the aberration, a method which utilizes an interferometer, is conventionally used. Various measurements of the aberration of projection lenses, with use of interferometers, are reported by the makers of the exposure devices.

However, for such a method of measuring the aberration of the projection lens, which uses an interferometer, it is necessary to provide a projection lens within a huge interferometer system. Therefore, once a projection lens is built in the main body of the exposure tool, the aberration thereof cannot be measured. Under these circumstances, there has been a great demand for developing an aberration measurement method which does not require an interferometer, in order to measure the aberration of the projection lens after the projection lens has been built in the main body of the exposure tool, or while operating the exposure tool.

In the meantime, the technique for evaluating the aberration from a projection image has been reported. As an example of measuring the astigmatism, there is a report in "Astigmatism and Field Curvature from Pin-Bars" by Joseph P. Kirk, Proc SPIE 1463, 282–291 (1991). In this document, the best focal difference of line patterns which cross normal to each other on an object plane, obtained on an image plane, is defined as the astigmatism, and it is calculated from the maximum value and the results of measurements of 4 types of patters obtained by setting the orientation degree to 0, 45, 90 and 135 degrees. That is, the astigmatism is the phenomenon that there is a difference in the best focus between two patterns which are orthogonal to each other in direction. However, in the case where the astigmatism is directed to 0° direction (X direction) or 90° direction (Y direction), there will be no difference in the best focus between a pattern directed in 45° direction and a pattern directed in 135° direction. Thus, the astigmatism cannot be measured unless the best focus of each of four types of patterns directed to 0°, 45°, 90° and 135°. Further, it is known that the relationship between the direction of a pattern and the best focus of its pattern takes a cosine curve theoretically, and therefore the amplitude and the direction of the maximum value obtained when it is curve-fitted with the cosine curve, is expressed as a parameter which characterizes the astigmatism.

In the case of the field curvature, it is measured as a distribution of average best focal points obtained from the above 4 types of patterns, within an exposure field. That is, the field curvature is a phenomenon in which the best focus has a distribution within an exposure field. The best focus position varies depending upon the direction of the pattern due to the astigmatism. Therefore, it is necessary to indicate the field curvature from the average best focus position of 4 patterns directed in the orientation degree to 0, 45, 90 and 135 degrees.

In the case of the coma, periodic patterns on an object, for example, a plurality of line patterns are considered, and it appears as a difference in width between the both ends of the periodic pattern. By measuring the difference in dimension, the aberration of the projection lens can be obtained.

However, in connection with the measurement of the aberration of the projection lens, which is based on the coma, as the size of the object pattern becomes smaller, the reticule manufacturing error and measurement error in the SEM become larger. Therefore, such a technique is not very advantageous for the measurement of the aberration of this sort.

Further, it is conventionally known that the coma displaces the transfer position due to a different in the size of the pattern or density thereof. For example, a 0.3 $\mu$m L/S pattern was superimposed on the Si step of a 0.6 $\mu$m L/S pattern and then they were exposed. From the superimposing state of these two types of the L/S patters, the coma was measured. (Takashi Saito et al., "Effect if Variable Sigma Aperture on Lens Distortion and its Pattern Size Difference", Proc. SPIE 2725, 414–423 (1996).) (Takashi Saito et al., "Overlay Error of Fine Patterns by Lens Aberration using Modified Illumination" Proc. SPIE 3051, 686–696 (1997).) However, the measuring method discussed in this document requires a great amount of time for preparing a measurement sample, and therefore it is not practical.

Next, in the case where the projection optics is a projection lens, and a specific example where the aberration thereof can be known by measuring the positional error of patterns, which results after the patterns on the photomask are transferred on a substrate, will now be described.

In the case of the coma, periodic patterns on an object, for example, a plurality of line patterns are considered, and it appears as a difference in width between the both ends of the periodic pattern. By measuring the difference in dimension, the aberration of the projection lens can be obtained.

First, the basic structure of the pattern transfer and the displacement of the focal point due to the difference in pattern size, which is the pattern width in the direction that diffraction light occurs, or pitch, which is a distance between patterns repeated, will now be described.

FIG. 1 is a schematic diagram showing how a pattern on a photomask is transferred on a substrate. A pattern 3 on a photomask 2 is illuminated by an illumination system 1, and the image thereof is formed on a substrate 5 via a projection optics. Here, the coherence factor σ is expressed by a ratio between a numerical aperture NAp of the projection optics 4 and a numerical aperture NAi of the illumination system 1.

The light wave diffracted by the pattern 3 formed on the photomask 2 is diffracted at a diffraction angle which is inversely proportional to the size and pitch of the pattern 3. Therefore, when the size and pitch are small, the light wave passes through a light path 7 indicated by two dot chain line, whereas when the size and pitch are large, it passes through a light path 8 indicated by one dot chain line.

As an aberration function 6 of the projection optics 4 is expressed by a curve of a function of the third order or the fifth order, with respect to the pupil radius of the lens, as shown in FIG. 1, since the light path 7 passes through a section where the inclination of the aberration function 6 is large, the image is formed at a point 9 on the substrate 5. On the other hand, the light path 8 passes through a section where the inclination of the aberration function 6 is small, the image is formed at a point 10 on the substrate 5. Thus, there results a difference between the focal positions 9 and 10 due to the difference in the pattern size and pitch.

It is known that the transfer position error due to the size and pitch of the pattern on the photomask causes an asymmetry between before and after the transfer of, for example, patterns of the size, made on both outer sides of five line patterns, as shown in FIG. 2.

The pattern 21 on the photomask before the transfer thereof forms a resist pattern 22 after the transfer. The pattern 21 on the photomask is a pattern which is expressed by a logical product of the periodic pattern 24 and the window pattern 23 including the entire pattern.

Therefore, the resist pattern 22 is also expressed by a logical product of the window pattern 23a after the transfer and the periodic pattern 24a after the transfer. However, the periodic pattern 24 has a size and pitch smaller than those of the window pattern 23, and therefore the transfer positions of the window pattern 23a and the periodic pattern 24a are displaced after the transfer. As a result, a difference is created in the widths L1 and L5 of the line patterns on both side of the resist pattern 22.

In the conventional technique, the difference in the widths of line patters is measured with use of an SEM, and it is used for the measurement of the aberration of a projection optics. However, with this technique, as described before, a strict mask measurement accuracy is required, and therefore when the size of patterns is very much reduced, it becomes difficult to supply photomasks therefor.

Under these circumstances, there has been a great demand of developing an easier measurement method than the conventionally known measurement of the aberration of a projection lens.

BRIEF SUMMARY OF THE INVENTION

The present invention has been proposed in consideration of the above-described circumstances, and the object thereof is to provide a projection optics aberration measuring method capable of measuring the aberration in a simple way from the comparison of the positions of patterns obtained by superimposing two kinds of patterns which are samples used for the measurement of the aberration of the projection lens.

In order to achieve this object, according to the present invention, there is provided a method of measuring aberration of a projection optics, comprising:

the first step of transferring a mask pattern including periodical patterns made of a plurality of unit patterns arranged on a photomask, in a direction normal to a first straight line at an equal interval, to be substantially linearly symmetrical with respect to the first straight line, on a substrate;

the second step of transferring a trim pattern arranged on the photomask to be substantially linearly symmetrical with respect to a second straight line corresponding to the first straight line, on the substrate and superimposing the trim pattern on the mask pattern made of the transferred periodic pattern, such as to remove a predetermined number of unit patterns at a central portion of the periodic pattern, from the substrate;

the third step of detecting a position of an outermost unit pattern out of a plurality of unit patterns of the transfer pattern formed in the first step, and a position of an innermost unit pattern out of these plurality of unit patterns of the transfer pattern, located adjacent to those removed in the second step; and the fourth step of measuring aberration of the projection optics present between the mask pattern of the photomask and the substrate, from a difference between both positions, detected in the third step.

There is further provided a method of measuring aberration of a projection optics, comprising:

the first step of transferring on a substrate a first mask pattern having a first pattern made of a periodic pattern in which a plurality of unit patterns are arranged on a photomask in a direction normal to a first straight line at an equal interval, and which is substantially linearly symmetrical with respect to the first line, and a second pattern which is substantially linearly symmetrical with respect to the first line, and made of a pair of unit patterns having a line width larger than that of the unit patterns;

the second step of transferring on the substrate a second mask pattern made of a pair of line patterns arranged on the photomask such as to be substantially linearly symmetrical to a second straight line set in relation to the first straight line, and another pair of line patterns located a distant away from the other pair of line patterns, and superimposing the transferred second mask pattern on the periodic pattern of the first mask pattern and the pair of unit patterns having a larger line width, in order to leave a predetermined number of unit patterns of the periodic pattern which is the first pattern and all of the pair of unit patterns having a larger line width, which is the second pattern;

the third step of detecting a value of a difference between a center position of a pair of edge signal waveforms obtained to correspond to a position of the pair of line patterns left as being superimposed in the second step, and a center position between a pair of edge signal waveforms obtained to correspond to a position of the other pair of line patterns; and the fourth step of measuring the aberration of the projection optics, which results between the mask pattern of the photomask and the substrate, from the value of the difference detected in the third step.

According to the present invention, there is still further provided a method of measuring aberration of a projection optics, comprising:

the first step of transferring, on a substrate, a mask pattern made of a periodic pattern in which a plurality of unit patterns are arranged on a photomask in a direction normal to a first straight line at an equal interval, and which is substantially linearly symmetrical with respect to the first line;

the second step of transferring, on the substrate, a trim pattern arranged on the photomask such as to be substantially linearly symmetrical to a second straight line set in relation to the first straight line, in order to remove a predetermined number of unit pattern of the periodic pattern and to form an opening edge, and superimposing the transferred trim pattern on the mask pattern made of the transferred periodic pattern;

the third step of detecting a position of the opening edge of the transfer pattern formed in the second step, and a position of an innermost unit pattern of those of the plurality of unit patterns of the transfer pattern formed in the first step, which are located adjacent to those opposing to the trim pattern, remaining without being removed after superimposed in the second step; and the fourth step of measuring the aberration of the projection optics, which is situated between the mask pattern of the photomask and the substrate, from a difference between both positions detected in the third step.

There is still further provided a method of measuring aberration of a projection optics, comprising:

the first step of transferring, on a substrate, a mask pattern having a first pattern made of a Y directional line and space in which a plurality of linear patterns are arranged in a Y axial direction normal to an X axial direction at an equal interval, such as to be linearly symmetrical with respect to the X axial direction, and an X directional line and space in which a plurality of linear patterns are arranged in an X axial direction normal to the Y axial direction at an equal interval, such as to be linearly symmetrical with respect to the Y axial direction, and a second pattern made of a Y directional line having a line width larger than that of the linear pattern, and arranged to be linearly symmetrical with respect to the X axis, and an X directional line having a line width larger than that of the linear pattern and arranged to be linearly symmetrical with respect to the Y axis;

the second step of transferring, on the substrate, a trim pattern and superimposing the transferred trim pattern on the mask pattern having the first and second patterns, in order to remove a predetermined number of line patterns in a central portion and a peripheral portion of the first pattern on the mask pattern in symmetrical manner with respect to the X axis and Y axis;

the third step of detecting a position in terms of the X axial direction and the Y axial direction, of the transfer pattern of the second pattern formed in the first step, and a position in terms of the X axial direction and Y axial direction, of those line pattern of the transfer pattern of the first pattern formed in the first step, which remain without being removed in the second step; and the fourth step of measuring the aberration of the projection optics, which is situated between the mask pattern of the photomask and the substrate, from the difference in the both positions detected in the third step.

With the above-described structures, the method of measuring the aberration of the projection optics according to the present invention, can achieve the following. That is, in the first and second exposure steps, a periodic pattern is transferred in one of these steps, and a trim pattern designed to remove a part of the periodic pattern is transferred in the other step. By superimposing these transferred patterns, the position of the inner edge of the periodic pattern which finally remains can be measured by an optical position measuring device in a sample way. Apart from this, a non-periodic pattern is transferred and the position thereof is measured. Thus, regarding an asymmetrical transfer which occurs in a particular pattern, the positional error which occurs after transfer due to pattern size and density can be measured, by comparing their positions, at a high accuracy and in a sample way.

As described, according to the present invention, the measurement can be performed easily without requiring a great amount of time for preparing measurement samples, and the measurement of the lens aberration can be carried out by measuring the patterns, at a high accuracy in a short period of time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 15 is a diagram showing another version of the pattern formed on the mask shown in FIG. 11;

FIG. 16 is a diagram showing a transfer pattern for measurement, formed by superimposing the patterns shown in FIG. 15;

FIG. 17 is a diagram showing a pattern on a photomask used for explaining the sixth embodiment of the method of measuring the aberration of the projection optics, according to the present invention;

FIG. 18 is a diagram showing a transfer pattern for measurement, formed in the sixth embodiment shown in FIG. 17;

DETAILED DESCRIPTION OF THE INVENTION

Embodiments of the method of measuring the aberration of the projection optics, according to the present invention will now be described in detail with reference to FIGS. 3 to 22.

(The First Embodiment)

Figure 3:
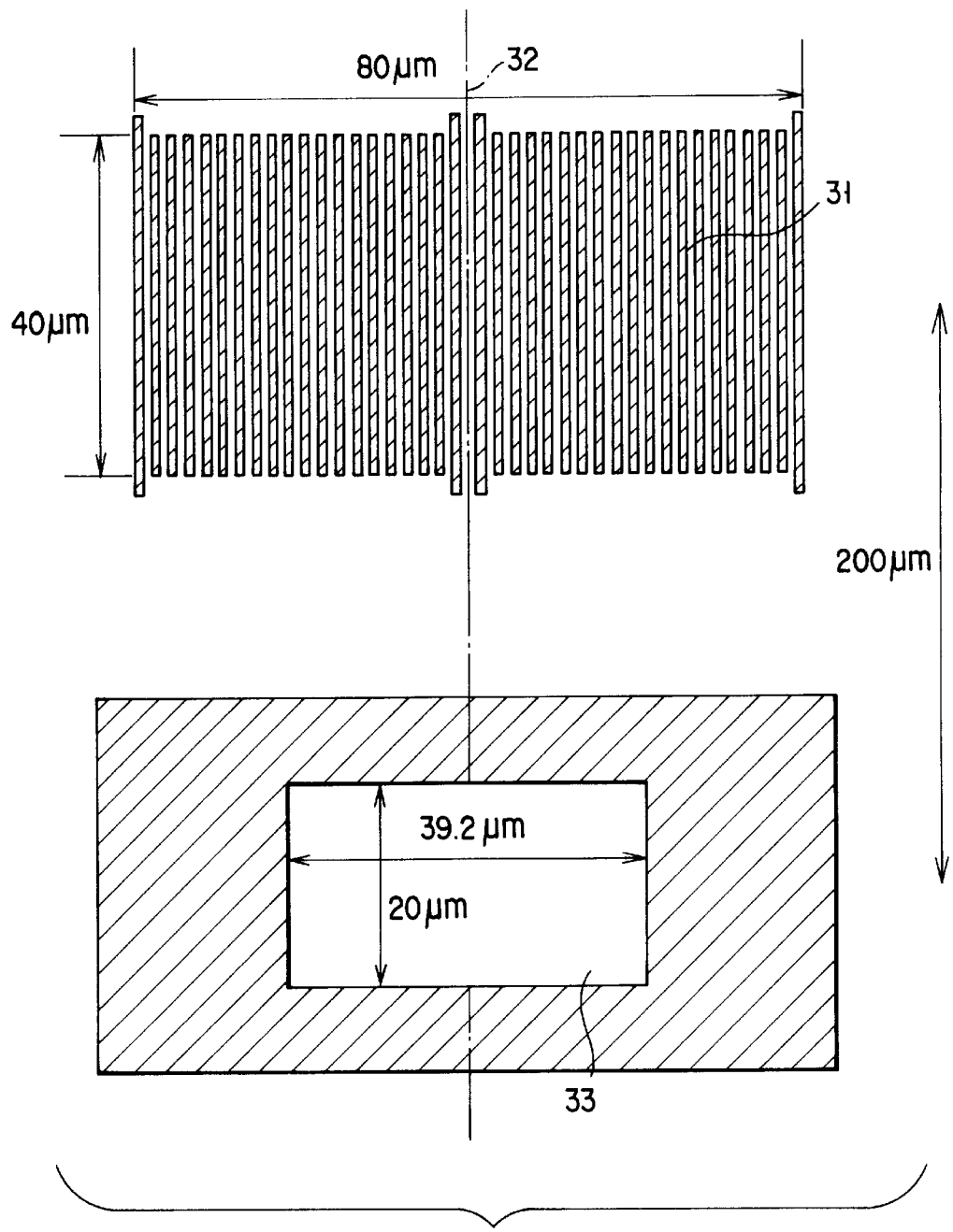
FIG. 3 is a diagram showing a pattern on a photomask used for explaining the first embodiment of the method of measuring the aberration of the projection optics, according to the present invention.

FIG. 3 is a diagram showing a pattern on a photomask used for explaining the first embodiment of the method of measuring the aberration of the projection optics, according to the present invention. In this figure, the photomask is not shown, but only patterns are shown.

As shown, a 0.8 $\mu$m-line and space pattern 31 formed by arranging linear patterns at an equal interval in a direction normal to a line 32, and symmetrical with respect to the line 32, and a 39.2 $\mu$m×20 $\mu$m trim pattern 33 which is symmetrical with respect to the line 32, are formed such that the distance taken between the centers of these patterns is 200 $\mu$m in the direction along the line 32.

The line and space pattern 31 on the photomask is exposed at an exposure dose of 18 mJ/cm$^2$ on a silicon wafer substrate (not shown) by using a krypton fluoride excimer laser exposure device (wavelength of 248 nm) having a reduction rate of ¼ (the first step). On the silicon wafer substrate, an anti-reflecting layer (DUV18, a product of Brewer Science Co.) is applied to have a thickness of 55 nm, and then a positive-type photoresist (S210J, a product of JSR Co.) is applied to have a thickness of 0.6 $\mu$m.

Subsequently, the photomask is moved 200 $\mu$m along the direction of the line 32, or the silicon wafer substrate is moved 50 $\mu$m in the direction corresponding to the line 32 when the reduction rate of the exposure device of the scan type is reduced to ¼ so as to superimpose the transfer pattern of the already transferred pattern 31 on the transfer pattern of the trim pattern 33, and then the superimposed pattern is exposed at an exposure dose of 17 mJ/cm$^2$ (the second step).

After the exposures in the first and second steps, the resist on the substrate is developed using a TMAH developing solution having a normality of 0.21.

The purpose of carrying out the transfer while superimposing the trim pattern 33 on the line and space pattern 31 is to remove a part of the transfer pattern of the line and space pattern 31. For this removal, it is important that the edge which forms the hole section of the trim pattern 33 is located in an inner space portion of the transfer pattern of the line and space pattern 31. When the exposure is conducted such that the edge of the trim pattern 33 is situated at the space section of the line and space pattern 31, the edge of the trim pattern 33 does not exist in the cross section taken along A—A which relates to the measurement of the measurement pattern 41 formed. Thus, regardless of the position of the trim pattern 33, a desired measurement can be carried out. Therefore, in this embodiment, it is designed that the edge of the trim pattern 33 is made smaller by about 50 nm with respect to the center of the space portion of the transfer pattern, in terms of position, and the exposure amount of the second exposure is controlled to be slightly excessive. In general, the light intensity distribution of the transfer image of a pattern, changes not discretely at the edge portion, but gradually and continuously. Therefore, the edge of a resist pattern formed after development can be slightly and finely changed in accordance with the exposure amount. Consequently, in order to accurately remove the pattern which is supposed to be removed in the second exposure and leave the pattern which is supposed to remain, it is necessary to control the position of the edge in the second exposure by adjusting the exposure dose. Further, regarding the movement of the mask and substrate, the accuracy of the movement totally depends upon the stage accuracy of the exposure tool. It has been confirmed that the movement can be made at an accuracy of about 10 nm in the case where these objects are moved on such a substrate for about 50 $\mu$m, and therefore the stage accuracy does not deteriorate.

Figure 4A:
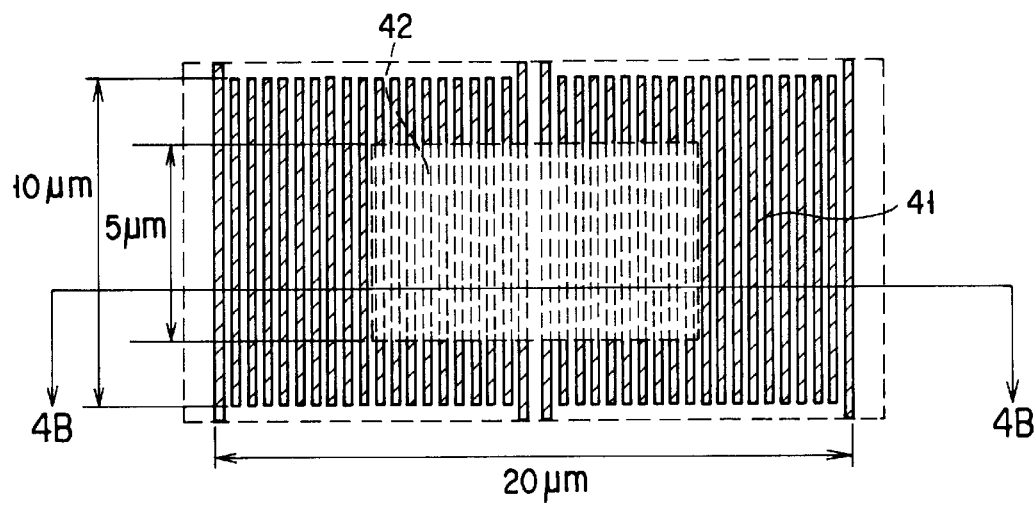
FIG. 4A is a diagram showing a transfer pattern for measurement, formed in the first embodiment shown in FIG. 3.

FIG. 4A shows a resist pattern obtained after the development. This figure shows a transfer pattern for measurement, having such a shape that the center portion of a 0.20 $\mu$m line and space pattern 41 formed by the first exposure is removed by a trim pattern 42 made by the second exposure.

Figure 4B:
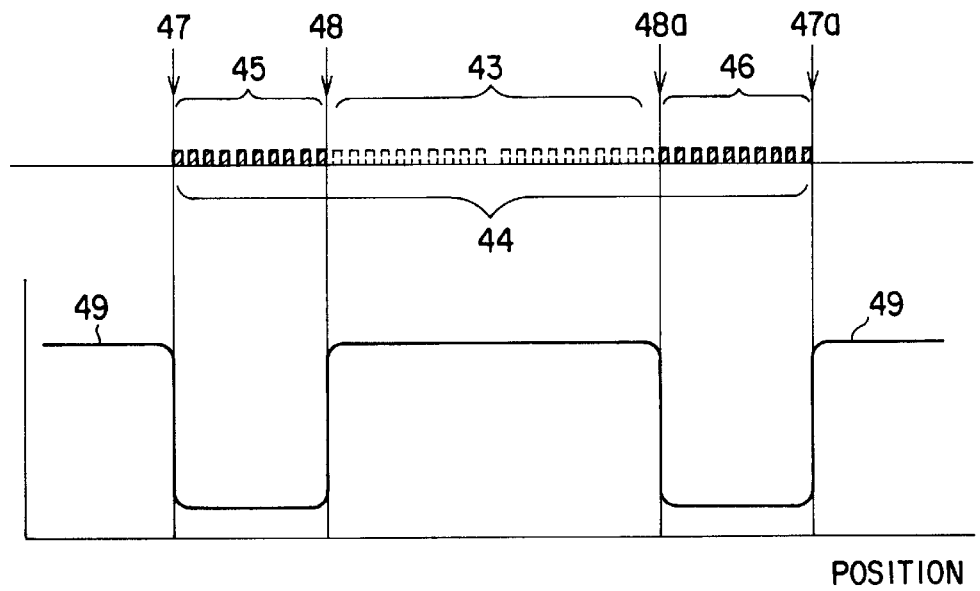
FIG. 4B is a diagram showing a reflection intensity and a detection signal of the transfer pattern for measurement, of the section in cross section taken along the line A—A in FIG. 4A.

In FIG. 4A, the reflection intensity at the cross section taken along the line 4B—4B can be indicated as shown in FIG. 4B. That is, in FIG. 4B, the intensity curve indicates the state that the line and space pattern 43 indicated by dotted line is removed from the 0.20 μm line and space pattern 44 formed by the first exposure.

A reflection intensity wave form 49 which is obtained when the finally formed pattern is measured with an optical alignment error length measuring device or the like, is made of a recessed U-shaped wave form taken between the outer side of the line and space pattern 44 and the section 43 from which the line and space pattern was removed, since the reflection intensity decreases due to diffraction, in the sections 45 and 46 where the line and space pattern remains.

Figure 1:
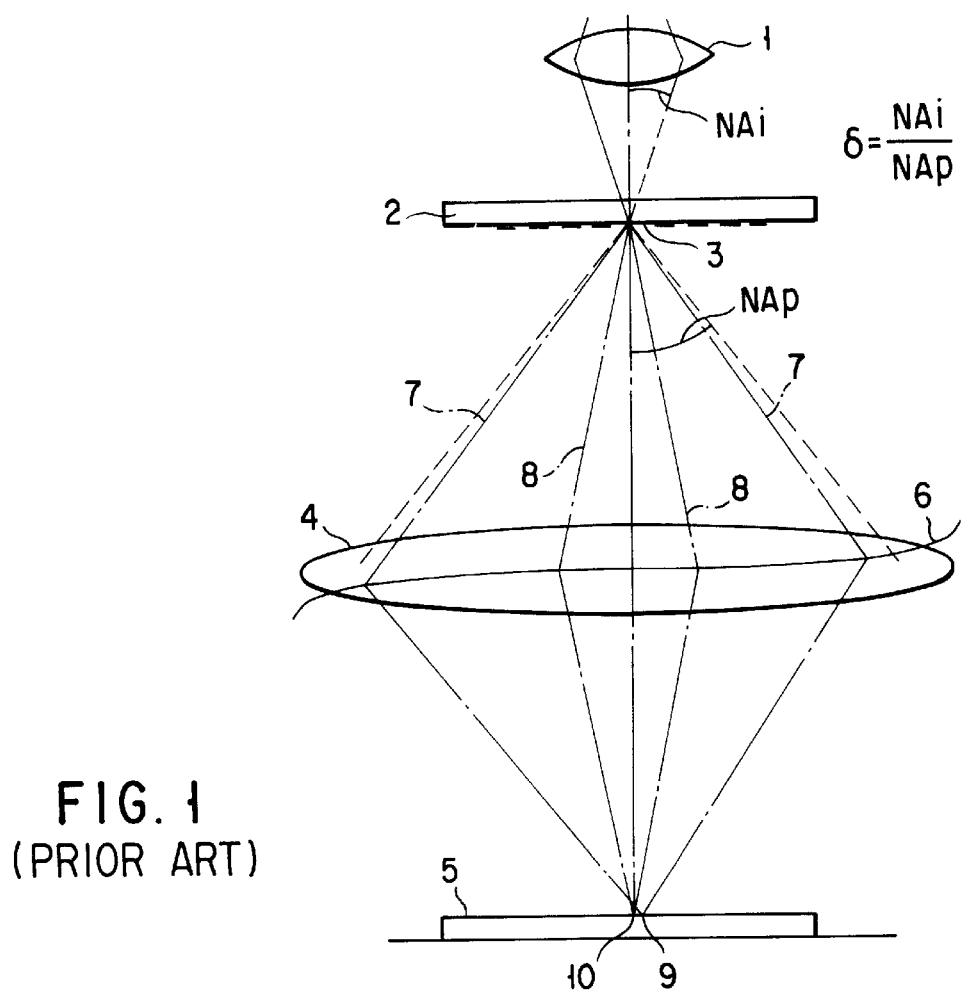
FIG. 1 is a diagram schematically showing how a pattern on a photomask which is used for the method of measuring aberration of the projection optics according to the present invention, is transferred on a substrate.
Figure 2:
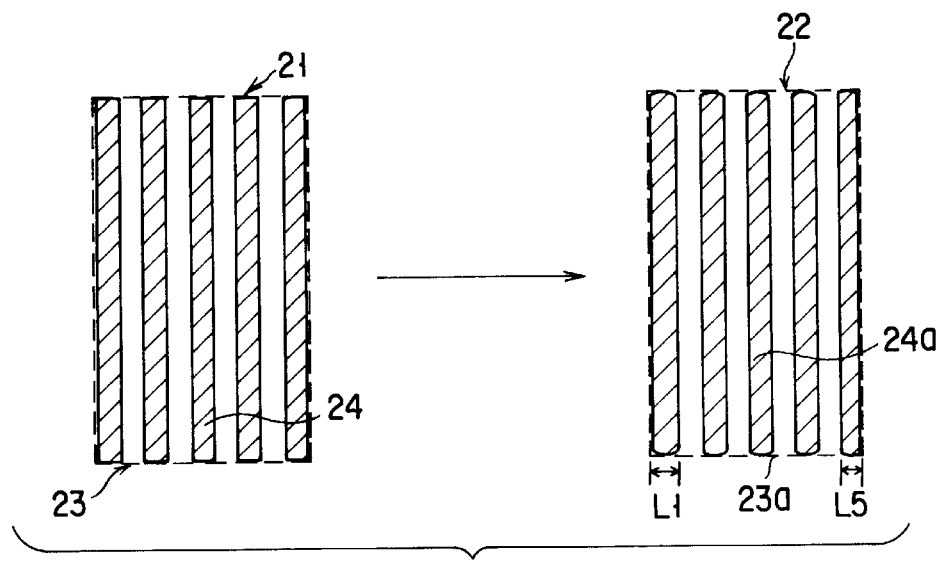
FIG. 2 is a diagram showing how the width of 5 line patterns on a photomask varies due to the aberration of the projection lens.

The falls 47 and 47a of the wave form indicate the transfer positions of the edge of both outer sides of the line and space pattern 41, and they have the same influence as the influence on the reflection intensity, caused by the longitudinal edge of a window pattern 23a which includes the entire line and space pattern shown in FIG. 2.

The rises 48 and 48a of the wave form indicate the transfer positions of a pair of opposing edges of the pattern corresponding to the trim pattern 33 within the line and space pattern which was exposed first.

Therefore, by measuring the difference between the center of edge signals 47 and 47a, and the center of edge signals 48 and 48a by an optical alignment error length measurement device or the like, the aberration of the projection lens can be measured from the 0.20 μm line and space pattern 41 and a resist pattern obtained after the transfer.

In this embodiment, an optical alignment error length measurement device is used; however the device is not limited to the optical type, but a similar measurement can be performed with an electron beam length measurement device or an ion beam length measurement device. Further, the order of the first step for exposing a line and space pattern, and the second step for forming a trim pattern may be reversed.

Further, in this embodiment, a measurement sample for measuring the aberration of the projection lens is prepared by the procedure carried out in the following order, that is, after the first exposure, the same photomask is shifted, then transfer patterns are superimposed one on another, and the second exposure, which is a double exposure, is carried out, and lastly a development is performed. However, the present invention is not limited to the double exposure which is carried out while the same photomask is shifted as above, but it is also possible to carry out an alignment exposure by different photomasks. More specifically, in this alternative case, a measurement sample is prepared by the procedure carried out in the following order, that is, after the first exposure, a development is performed, then an etching is carried out, and an alignment exposure is performed using a different photomask, and lastly a development is carried out. It should be noted that in this case, the axis (the first line) of the symmetry of the mask pattern used for the first exposure and the axis (the second line) of the symmetry of the mask pattern used for the second exposure must be made coincide with each other on the substrate.

As described above, according to the first embodiment, it is possible to obtain a mark which can be easily detected for the transfer error of patterns which are arranged periodically, merely by performing two exposures; the first exposure for the line and space pattern 41 and the second exposure for removing a part of the line and space pattern. With the mark obtained, the pattern measurement carried out for examining the aberration of the projection lens can be performed in a short period of time and at a high accuracy, without requiring much time for preparing a measurement sample.

Further, even if the size of the periodic pattern is smaller than the resolution of the measurement device, the position of the pattern within the period can be detected. For example, in the case where the transfer alignment error of a 0.20 μm line and space pattern is to be measured with an optical measurement device, it is not possible to measure the alignment error of a particular pattern within the period if the size is smaller than the resolution of an ordinary optical device. However, with use of the measurement mark of this embodiment, such an error is fully measurable.

(The Second Embodiment)

Figure 5:
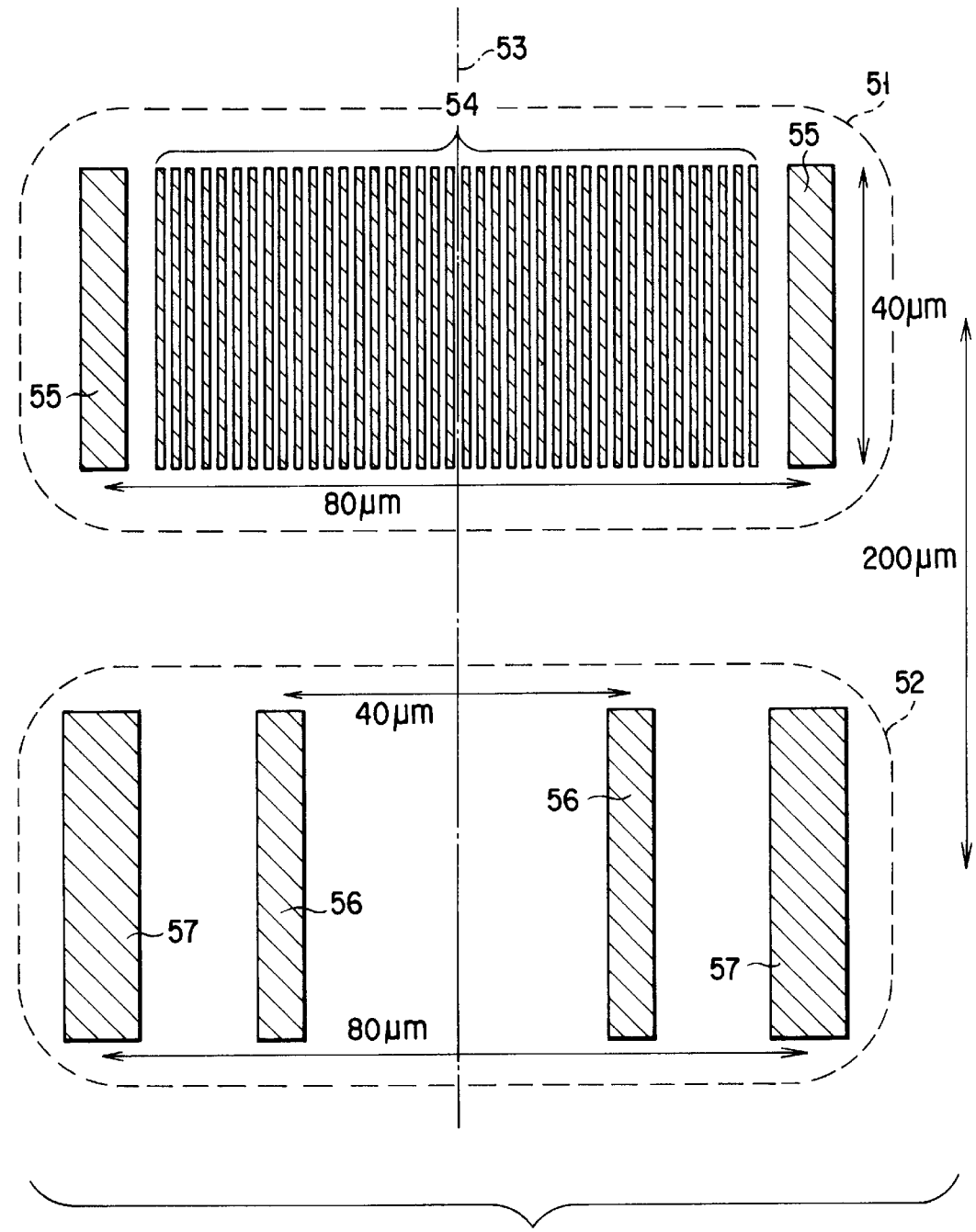
FIG. 5 is a diagram showing a pattern on a photomask used for explaining the second embodiment of the method of measuring the aberration of the projection optics, according to the present invention.

FIG. 5 is a diagram showing a pattern on the photomask used in the second embodiment of the present invention. In this figure, the photomask is not shown.

The pattern on the photomask is divided into a pattern 51 for the first exposure and a pattern 52 for the second exposure, both of which have a shape which is linearly symmetrical with respect to a line 53. The pattern 51 is made of a 0.80 μm line and space pattern (the first pattern) 54, and two 8 μm line patterns (the second patterns) 55 arranged to be 80 μm distant from each other, and situated on an outer side of the line and space pattern.

The pattern 52 is made of two 8 μm line patterns 56 arranged to be 40 μm distant from each other, and two 12 μm line patterns 57 arranged to be 80 μm distant from each other.

The line pattern 56 in the pattern 52 for the second exposure is formed such as to cover a part of the line and space pattern 54 on the transfer substrate, when is transferred. The line pattern 57 is formed such as to cover the entirety of the line pattern 55, when is transferred. In short, the pattern 52 serves as a trim pattern for removing the center portion and peripheral portion of the line and space pattern 54.

As in the case of the first embodiment, the pattern 51 on the photomask is exposed at an exposure amount of 18 mJ/cm$^2$ on a silicon wafer substrate on which an anti-reflection film DUV18 is applied to have a thickness of 55 nm, and then a positive-type photoresist S210J is applied to have a thickness of 0.6 μm, by using a krypton fluoride excimer laser exposure device having a rate of reduction of ¼ (the first step).

Subsequently, the photomask is moved 200 μm along the direction of the line 53, or the silicon wafer substrate is moved 50 μm in the direction corresponding to the line 53 so as to superimpose the transfer pattern of the pattern 52 on the transfer pattern of the already transferred pattern 51, and then the superimposed pattern is exposed at an exposure amount of 17 mJ/cm$^2$ (the second step).

After the exposures in the first and second steps, the resist on the substrate is developed using a TMAH developing solution having a normality of 0.21.

Figure 6A:
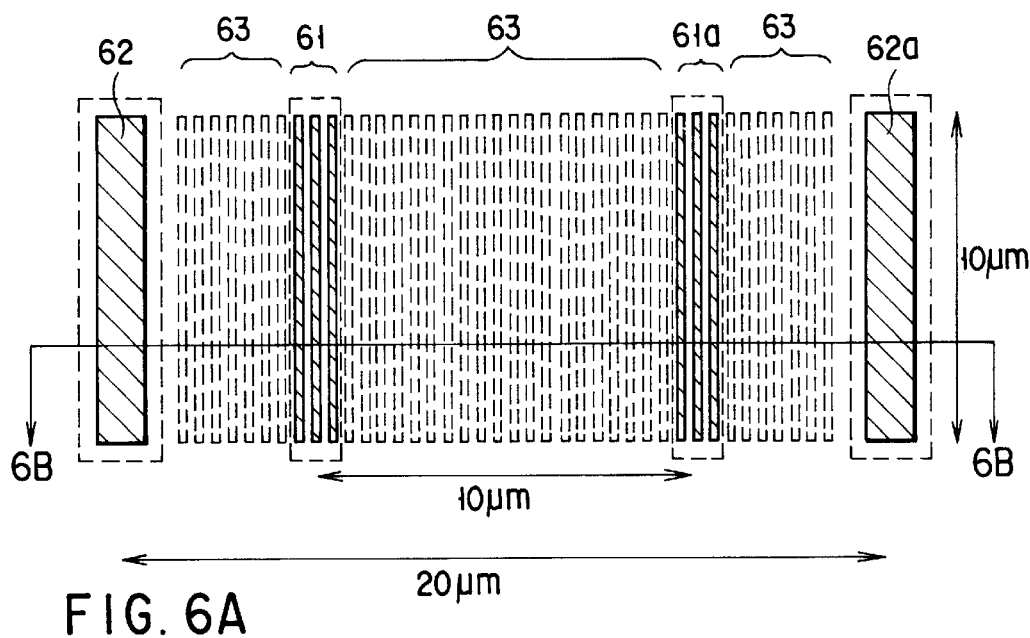
FIG. 6A is a diagram showing a transfer pattern for measurement, formed in the second embodiment shown in FIG. 5.

FIG. 6A shows the resist pattern obtained after the development. Two 2 μm line patterns 62 and 62a and two pairs of 0.20 μm line and space patterns 61 and 61a are formed. Then, of the line and space patterns transferred by the first exposure, the portions indicated by reference numeral 63 are removed by the second exposure.

Figure 6B:
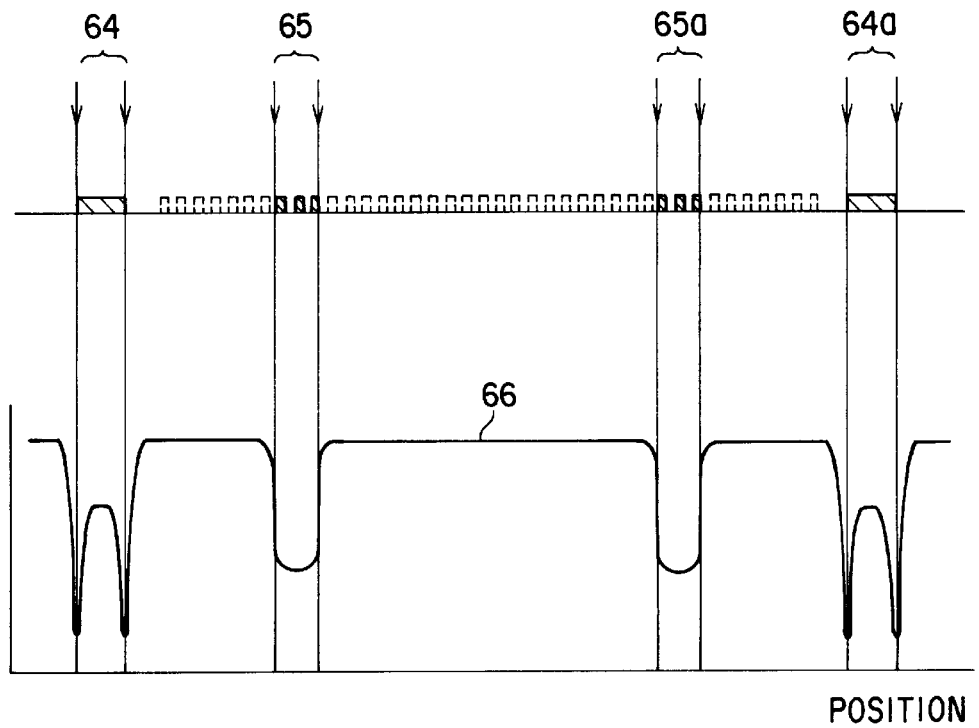
FIG. 6B is a diagram showing a reflection intensity and a detection signal of the transfer pattern for measurement, of the section in cross section taken along the line A—A in FIG. 6A.

Therefore, as shown in FIG. 6B, from a reflection intensity waveform 66 obtained when an evaluation pattern is measured with the optical alignment error length measurement device or the like, edge signals 64 and 64a of the 2 μm line patterns 62 and 62a and edge signals 65 and 65a of the 0.20 μm line and space patterns 61 and 61a are obtained. Thus, the positional difference between the middle point of the signals 64 and 64a and the middle point of the signals 65 and 65a can be measured. In this manner, the aberration of the projection lens which occurs between the 0.20 μm line and space patterns and the silicon wafer substrate, can be measured as in the case of the first embodiment. In this case, the degree of the aberration can be expressed in the movement amount of the 0.2 μm line and space pattern.

As described above, the pattern measurement for measuring the lens aberration can be carried out accurately in a short period of time, as in the first embodiment. Further, the signal profile obtained from a transfer pattern used for measurement, which is presented in this embodiment, has a high symmetry of a pair of wave forms on right and left hand sides, as compared to the signal profile obtained from the measurement-use transfer pattern obtained by the second exposure used in the first embodiment. Thus, due to the curve fitting of signal waveforms on the left- and right-hand sides, a highly accurate measurement can be performed.

(The Third Embodiment)

Figure 7:
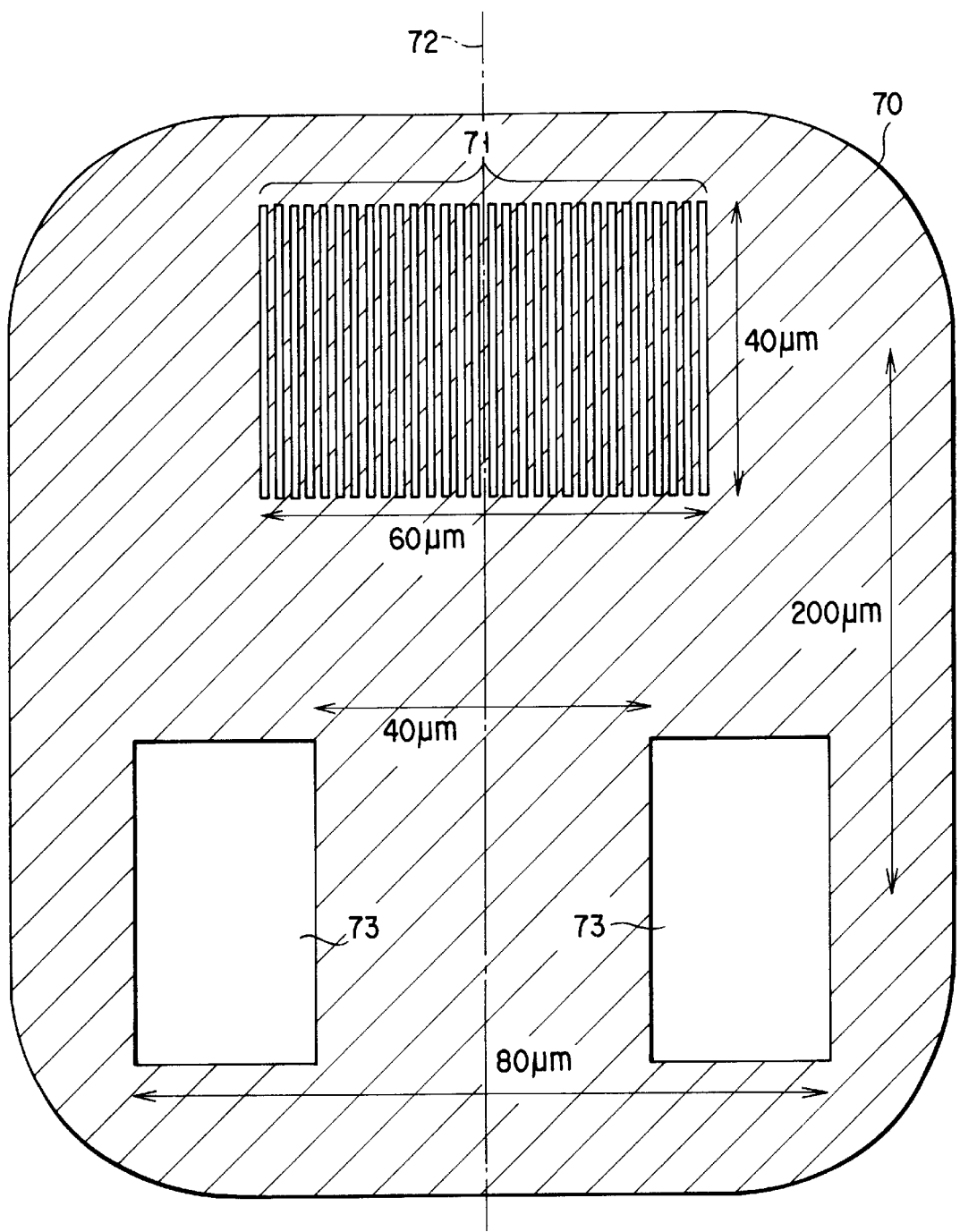
FIG. 7 is a diagram showing a pattern on a photomask used for explaining the third embodiment of the method of measuring the aberration of the projection optics, according to the present invention.

FIG. 7 is a diagram showing a pattern on a mask, which is used in the third embodiment of the present invention.

The pattern on the photomask 70 is divided into a 0.80 μm line and space pattern 71 for the first exposure and a trim pattern 73 having a width of 0.80 μm, for the second exposure, both of which have a shape which is linearly symmetrical with respect to a line 72. The line and space pattern 71 has a shape similar to those of the first and second embodiment; however the peripheral portion of this pattern is a section to be removed after the second exposure.

As in the case of the first embodiment, the pattern 71 is exposed, using this photomask, at an exposure dose of 18 mJ/cm² on a silicon wafer substrate on which an antireflection layer DUV18 is applied to have a thickness of 55 nm, and then a positive tone resist S210J is applied to have a thickness of 0.6 μm, by using a krypton fluoride excimer laser exposure device having a reduction rate of ¼ (the first step).

Subsequently, the photomask 70 is moved 200 μm along the direction of the line 72, or the silicon wafer substrate is moved 50 μm in the direction corresponding to the line 72 so as to superimpose the transfer pattern of the trim pattern 73 on the transfer pattern of the already transferred pattern 71, and then the superimposed pattern is exposed at an exposure dose of 17 mJ/cm² (the second step).

After the exposures in the first and second steps, the resist on the substrate is developed using a TMAH developing solution having a normality of 0.21.

Figure 8A:
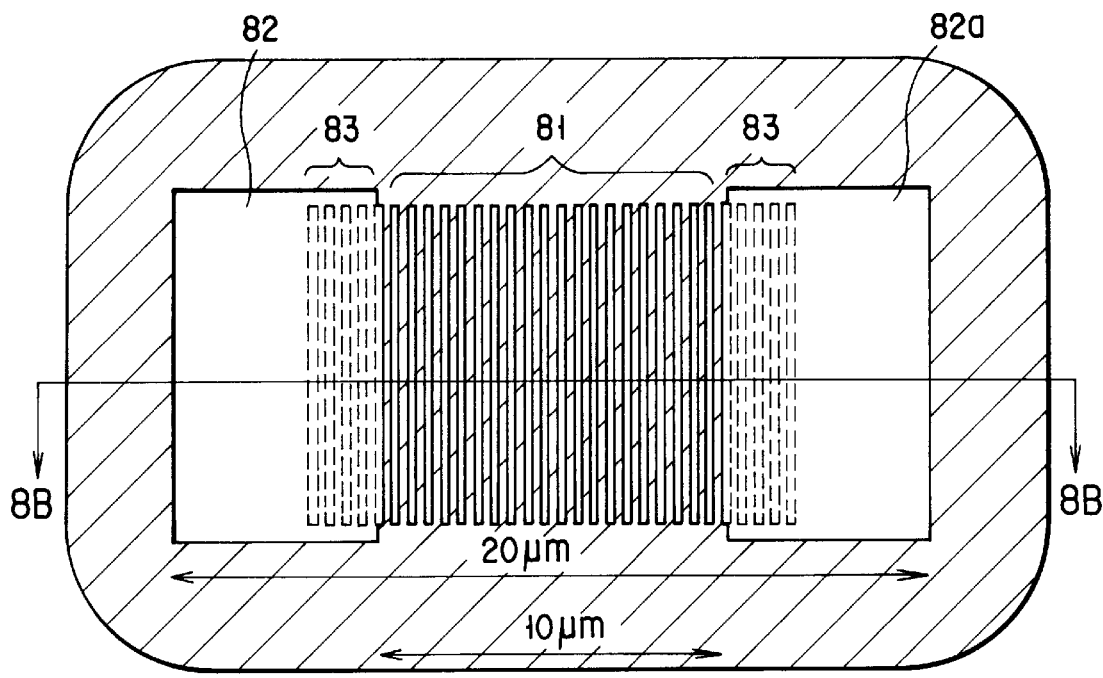
FIG. 8A is a diagram showing a transfer pattern for measurement, formed in the third embodiment shown in FIG. 7.

FIG. 8A shows the resist pattern obtained after the development. Two trim patterns 82 and 82a and a pair of 0.20 μm line and space patterns 81 are formed. Then, of the line and space patterns transferred by the first exposure, the portions indicated by reference numeral 83 are removed by the second exposure.

Figure 8B:
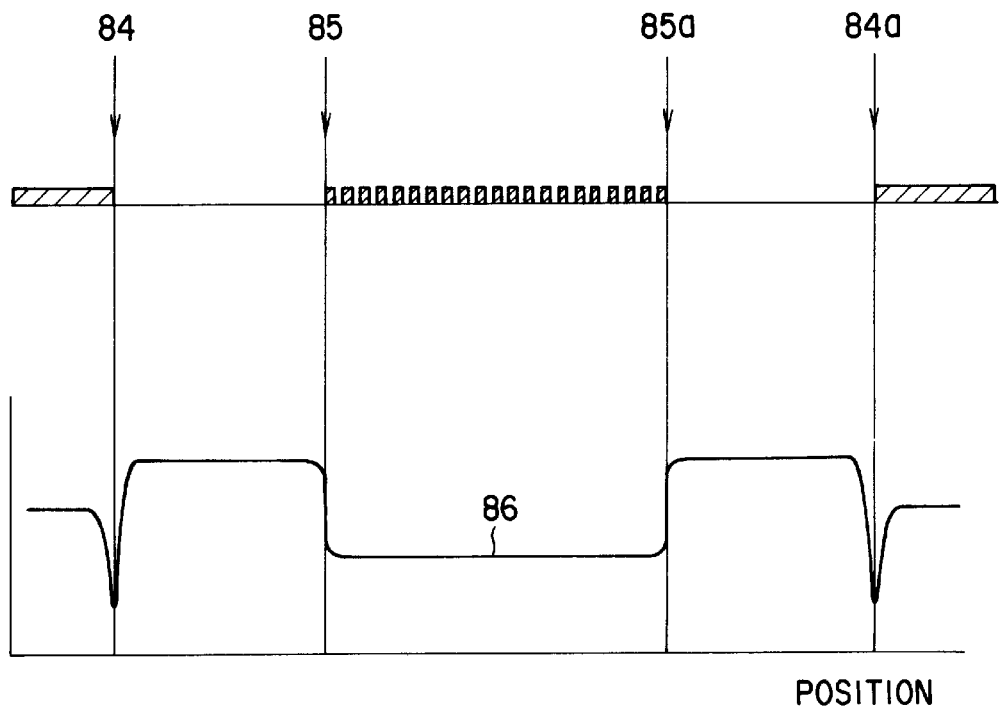
FIG. 8B is a diagram showing a reflection intensity and a detection signal of the transfer pattern for measurement, of the section in cross section taken along the line A—A in FIG. 8A.

Therefore, from a reflection intensity waveform 86 shown in FIG. 8B, which is in the part of the cross section taken along the line 8B—8B of FIG. 8A, and obtained when a pattern transferred on the substrate is measured with the optical alignment error length measurement device or the like, edge signals 84 and 84a of the 1.25 μm trim pattern 82, and edge signals 85 and 85a of the 0.20 μm line and space pattern 81 are obtained. Thus, the positional difference between the middle point of the signals 84 and 84a and the middle point of the signals 85 and 85a can be measured. In this manner, the aberration of the projection lens which occurs between the 0.2 μm line and space patterns and the silicon wafer substrate, can be measured as in the case of the first embodiment. However, it this case, the positional error between the first and second exposures is inevitably contained in the measurement result, and therefore it is necessary to measure in advance some other positional error measurement mark, and take the measured error into consideration.

As described above, with the third embodiment, it is possible to perform the measurement of the lens aberration accurately in a short period of time by carrying out a pattern measurement as in the first embodiment.

(The Fourth Embodiment)

Figure 9:
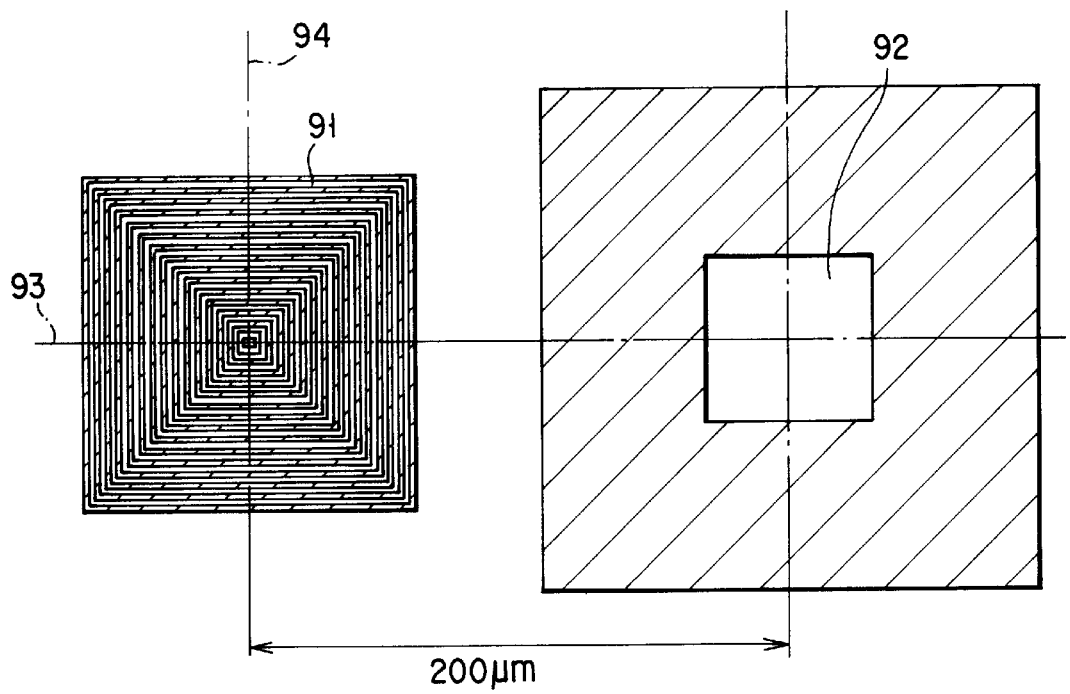
FIG. 9 is a diagram showing a pattern on a photomask used for explaining the fourth embodiment of the method of measuring the aberration of the projection optics, according to the present invention.

FIG. 9 is a diagram showing a pattern on the photomask, which is used in the fourth embodiment of the present invention. In this figure, the photomask is not shown.

This embodiment is a version in which the first embodiment is expanded in two dimensions, and it becomes possible to carry out measurements in two directions (for example, X and Y directions) at the same time. More specifically, as shown in FIG. 9, on a photomask, a rectangular annular pattern 91 obtained by synthesizing a line and space pattern which is linearly symmetrical with respect to a straight line (X axis) 93 and a line and space pattern which is linearly symmetrical with respect to a straight line (Y axis) 94 which crosses normal to the straight line 93 together, is formed.

Further, a rectangular trim pattern 92 which is linearly symmetrical with respect to the straight line 93 is formed at a section on the photomask, which is distant by 200 μm in a direction of the straight line 93.

Figure 10:
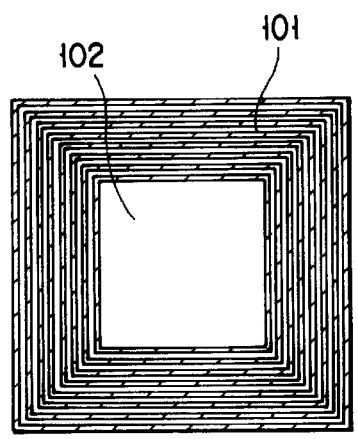
FIG. 10 is a diagram showing a transfer pattern for measurement, formed in the fourth embodiment shown in FIG. 9.

FIG. 10 shows a pattern formed by carrying out two exposures as in the first embodiment, with use of the photomask. In this pattern, a pattern 101 which is obtained by removing a part of the transfer pattern of the pattern 91, and a pattern 102 which is the transfer pattern of the trim pattern 92 are formed. On the basis of the same principle as in the first embodiment, the influence of the aberration of the projection lens can be measured with regard to both of the directions corresponding to the straight lines 93 and 94.

(The Fifth Embodiment)

Figure 11:
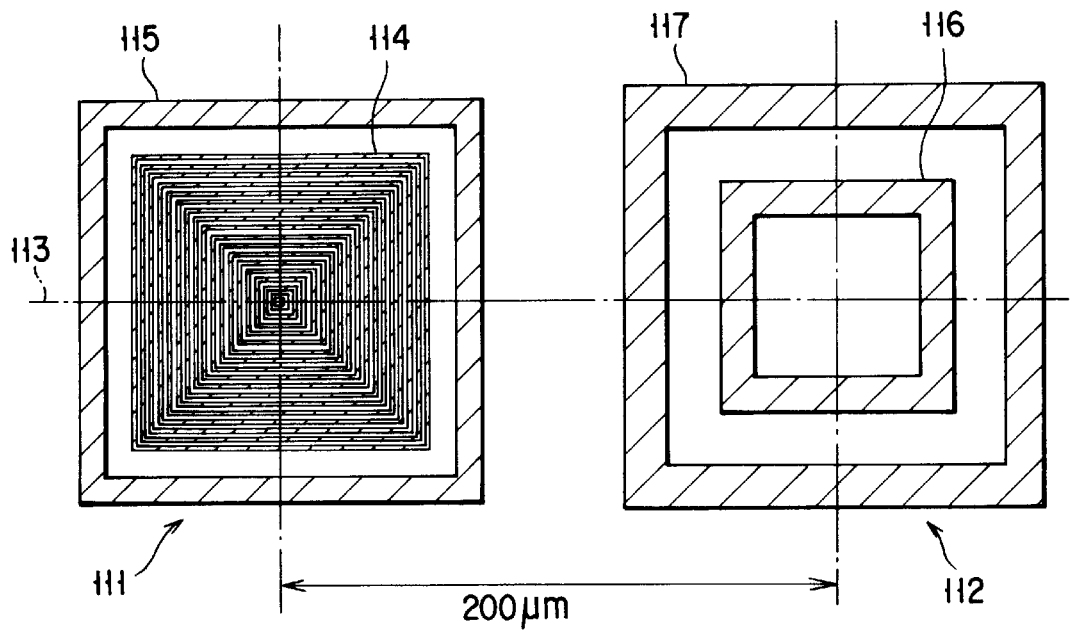
FIG. 11 is a diagram showing a pattern on a photomask used for explaining the fifth embodiment of the method of measuring the aberration of the projection optics, according to the present invention.

FIG. 11 is a diagram showing a pattern on the photomask, which is used in the fifth embodiment of the present invention.

This embodiment is a version in which the second embodiment is expanded in two dimensions, and it becomes possible to carry out measurements in two directions (for example, X and Y directions) at the same time. More specifically, as shown in FIG. 11, a pattern on a photomask is divided into a pattern 111 for the first exposure and a pattern 112 for the second exposure, and both of which have a design which is linearly symmetrical with respect to a straight line 113.

The pattern 111 consists of a rectangular annular pattern (the first pattern) 114 which is a combination of a 0.80 μm line and space pattern arranged in the direction normal to the straight line 113 and a 0.80 μm line and space pattern arranged in the direction of the straight line 113, and a rectangular annular pattern 115 formed in an outer side of the first pattern, having a length of one side of 80 μm and a width of 8 μm.

The pattern 112 consists of a rectangular annular pattern 116 having a length of one side of 40 μm and a width of 8 μm, and a rectangular annular pattern 117 formed in an outer side of the first pattern, having a length of one side of 80 μm and a width of 12 μm.

Figure 12:
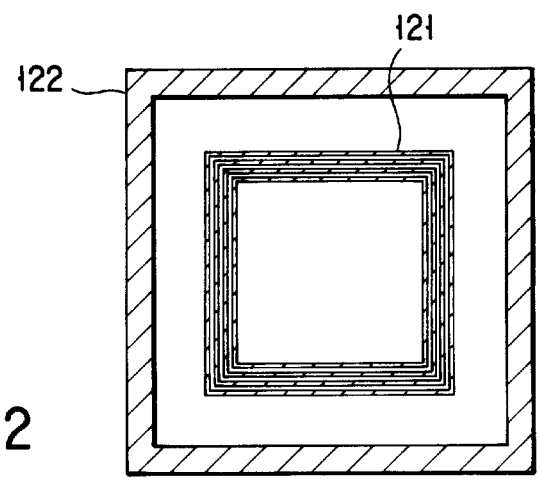
FIG. 12 is a diagram showing a transfer pattern for measurement, formed in the fifth embodiment shown in FIG. 11.

FIG. 12 shows an evaluation pattern formed by carrying out the first and second exposures with use of the photomask. In this pattern, a pattern 101 which is obtained by removing a part of the transfer pattern of the pattern 114, and a pattern 122 which is the transfer pattern of the trim pattern 115 are formed.

With use of the transfer pattern, the influence of the aberration of the projection lens can be measured with regard to both of the directions corresponding to and normal to the straight line 113 on the basis of the same principle as in the second embodiment.

Figure 21:
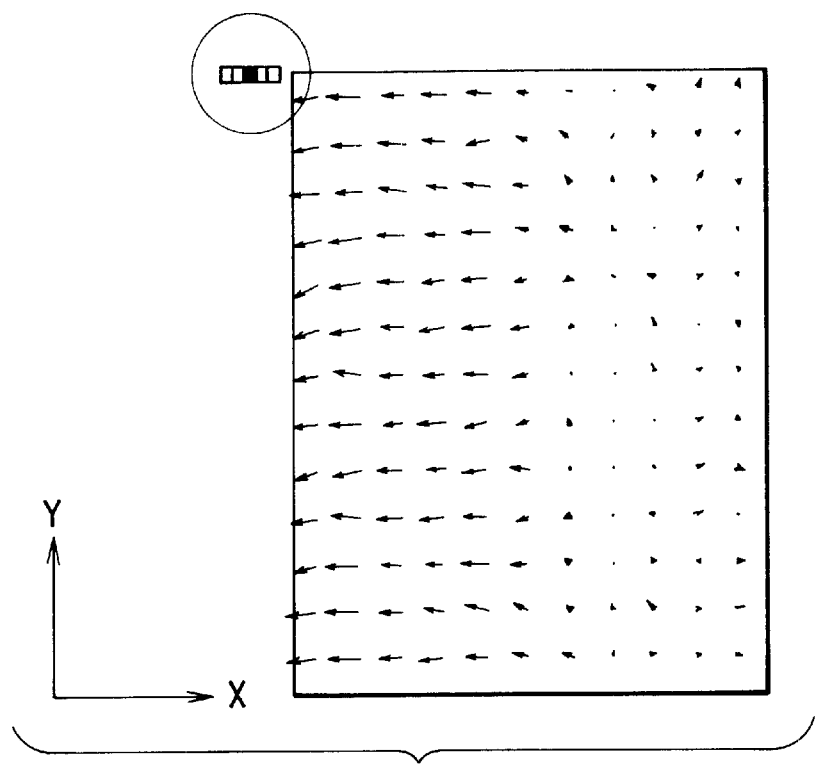
FIG. 21 is a diagram illustrating a position error distribution of an example of the results of the measurement in the fourth embodiment.

FIG. 21 shows the results of the measurement of the error of the transfer position of the 0.30 μm line and space pattern, with a scanner krypton fluoride excimer laser exposure tool, in this embodiment. The shot size was 25 mm×33 mm, and the shot section was exposed in such a manner that a slit-like exposure field is scanned in the Y direction.

The exposure conditions were: numerical aperture NA=0.6 and coherence factor σ=0.75.

The results indicate that there is a tendency of expanding in the X direction and the center of the expansion is displaced to the right-hand side of the center of the shot section. More specifically, in FIG. 21, in connection with the X direction, all the arrows are directed outwards with respect to the center which is located on the right side of the shot. When arrows are directed outwards, there is an expanding tendency, whereas when they face inwards, there is a contraction tendency. In general, the phenomenon that the position of a transferred pattern is displaced, is corrected by means of the correction function equipped in the exposure device. For this correction, there are 6 correction parameters to be input, namely, the expansion in X direction, expansion in Y direction, shift in X direction, shift in Y direction, the rotation of shot, and the linearity of X axis and Y axis of the shot. With reference to the vector map shown in FIG. 21 in consideration of these correction parameters, it can be understood that the distribution indicates that the correction can be fully carried out with two correction parameters, that is, the expansion in X direction and shift in X direction.

Figure 13:
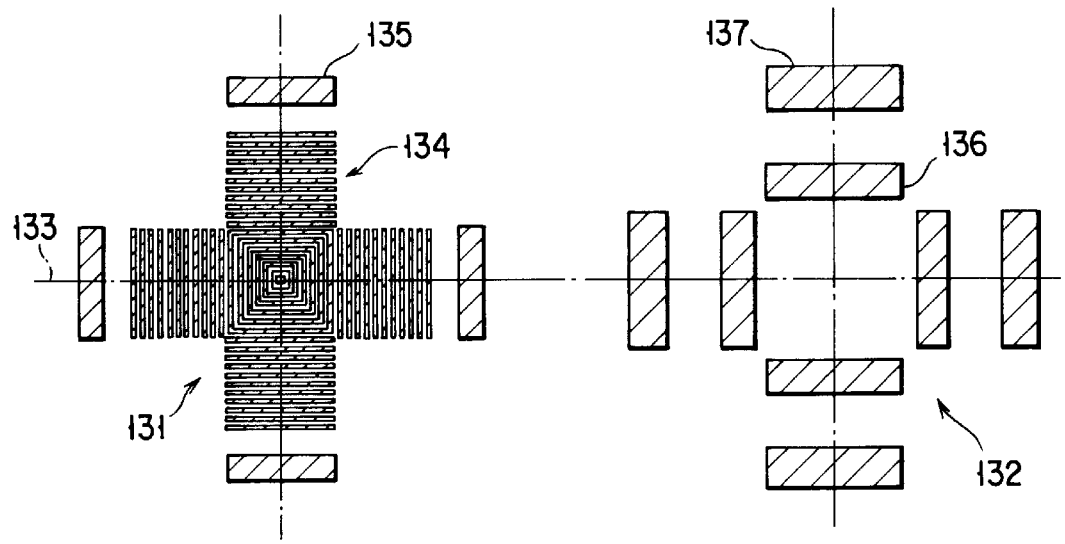
FIG. 13 is a diagram showing another version of the pattern formed on the mask shown in FIG. 11.

In FIG. 11, both the patterns 111 and 112 are rectangular; however it is alternatively possible that only a pattern portion which is necessary for the measurement is formed as in the patterns 131 and 132 shown in FIG. 13. In this case, the transfer patterns 141 and 142 as shown in FIG. 14 can be obtained.

It is further possible that patterns 155 and 157 having large line widths are formed at a center portion and line and space patterns 154 and 156 having small line widths are formed in the four peripheral portions, as the patterns 151 and 152 shown in FIG. 15. In this case, transfer patterns 161 and 162 which are shown in FIG. 16 can be obtained by the second exposure.

Figure 14:
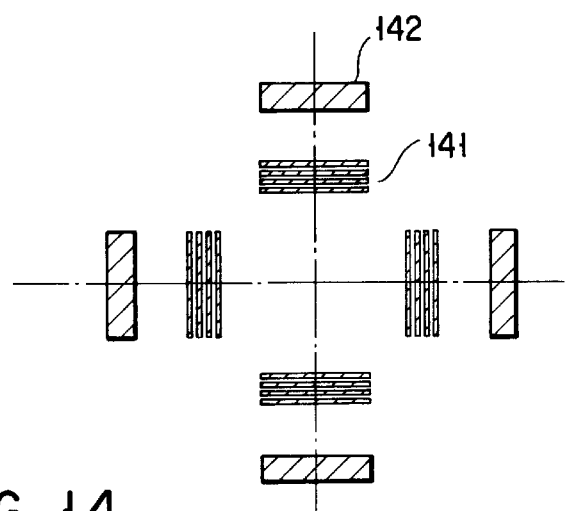
FIG. 14 is a diagram showing a transfer pattern for measurement, formed by superimposing the patterns shown in FIG. 13.

In either case of FIGS. 14 and 16, the aberration of the projection lens which is located between the line and space patterns and the silicon wafer substrate can be measured by measuring the position error between the transfer pattern 161 of a pair of line and space patterns arranged in the direction of X axis or Y axis, and the transfer pattern 162, as in the case of the second embodiment.

(The Sixth Embodiment)

FIG. 17 is a diagram showing a pattern on the photomask, which is used in the sixth embodiment of the present invention.

This embodiment is a version in which the measurement range of the third embodiment is expanded in two dimensions, and it becomes possible to carry out measurements in two directions at the same time. More specifically, on a photomask, a rectangular annular pattern 171 obtained by synthesizing a line and space pattern which is linearly symmetrical with respect to a straight line 172 and a line and space pattern which is linearly symmetrical with respect to a straight line which crosses normal to the straight line 172 together, is formed, and the peripheral section forms a non-trim pattern. Further, in a region located distant in the direction of the straight line 172, a rectangular pattern 175 which is linearly symmetrical with respect to the straight line 172, and a rectangular annular pattern 176 which surround the pattern 175 are formed. Further, between the patterns 175 and 176, a rectangular annular trim pattern 173 is formed. Here, the outer diameter of the pattern 176 is larger than the outermost diameter of the pattern 171, and the inner diameter of the pattern 176 is smaller than the outermost diameter of the pattern 171.

FIG. 18 shows a transfer pattern obtained by using the photomask, after two exposures are carried out. As shown, a pattern 184 obtained by removing a part of the transfer pattern 185 of the pattern 171 and a transfer pattern which reflects the outer side edge of the pattern 176 are formed. With this embodiment, the aberration of the projection lens can be measured with regard to both of the direction corresponding to the straight line 172 (that is, X axial direction) and the direction normal to the straight line (that is, Y axial direction), on the basis of the same principle as in the third embodiment.

Figure 22:
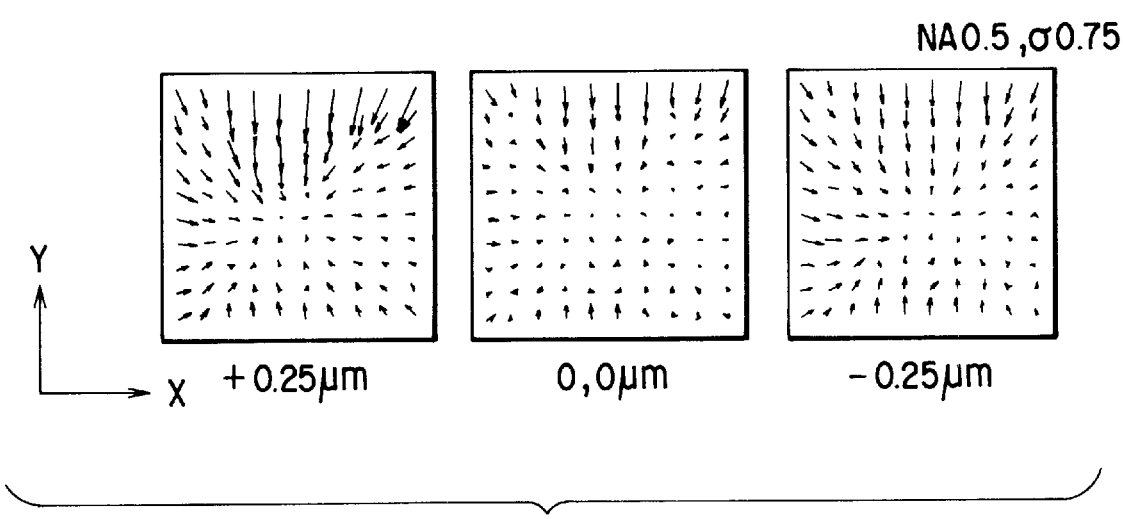
FIG. 22 is a diagram illustrating a position error distribution of an example of the results of the measurement in the fifth embodiment.

FIG. 22 shows the results of the measurement of the error of the transfer position of the 0.35 μm line and space pattern, with an i-ray exposure tool of a batch-transfer-type (wavelength of 365 nm), in this embodiment. The exposure conditions were: numerical aperture NA=0.5 and coherence factor σ=0.75, and the shot size was 20 mm×20 mm.

From this figure, it is confirmed how the positional error distribution varies along with defocusing.

(The Seventh Embodiment)

Figure 19:
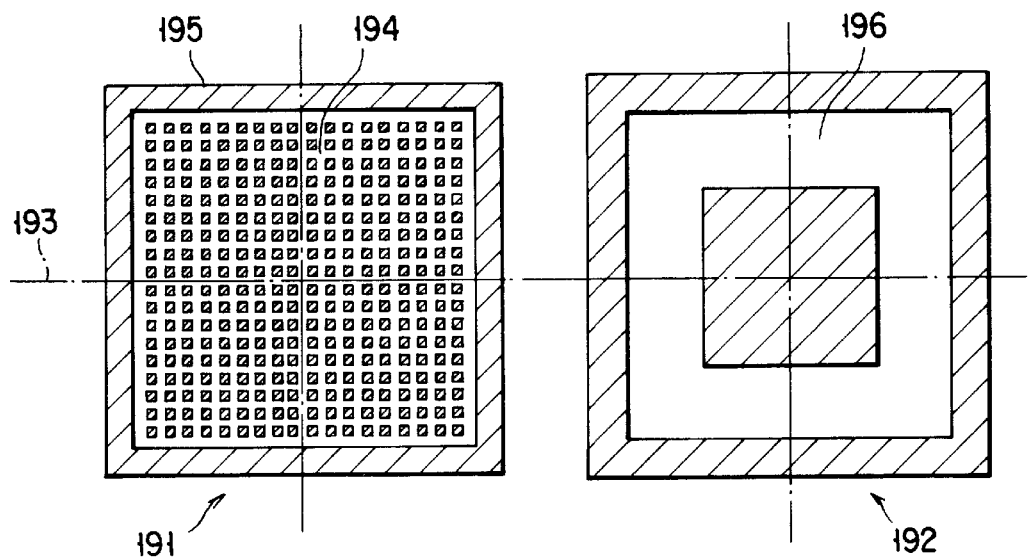
FIG. 19 is a diagram showing a pattern on a photomask used for explaining the seventh embodiment of the method of measuring the aberration of the projection optics, according to the present invention.

FIG. 19 is a diagram showing a pattern on the photomask, which is used in the seventh embodiment of the present invention. In this figure, the photomask is not shown.

This embodiment is an alternative version to the fifth embodiment shown in FIG. 11, and employs a hole pattern in place of the line and space pattern serving as a periodical pattern which is the target of the measurement. In the case of the measurement of such a periodical trim pattern, it is advantageous that a negative-type resist should be used in place of a positive-type resist, because the use of a negative resist, the problem of the resist falling would not occur.

A pattern on a photomask is divided into a pattern 191 for the first exposure and a pattern 192 for the second exposure, and both of which have a design which is linearly symmetrical with respect to a straight line 193. The pattern 191 consists of a periodical hole pattern (the first pattern) 194 placed such as to be linearly symmetrical with respect to the line 193 and a rectangular annular pattern (the second pattern) 195 formed to surround the first pattern.

The pattern 192 has a rectangular trim pattern 196 designed to removed the peripheral portion of the pattern 194 (that is, to close the hole).

In this embodiment, with use of the photomask of a periodic hole pattern having a hole diameter of 1.20 μm and a pitch of 2.40 μm, a substrate on which a negative tone resist (TDUR-N908 of Tokyo Ouka Co.) is applied, is exposed two times by using a krypton fluoride excimer laser exposure tool having a reduction rate of ¼. Then, the development is performed with use of a TMAH developing solution having a normality of 0.27. The diameter of the hole pattern made on the substrate is 0.30 µm.

Figure 20:
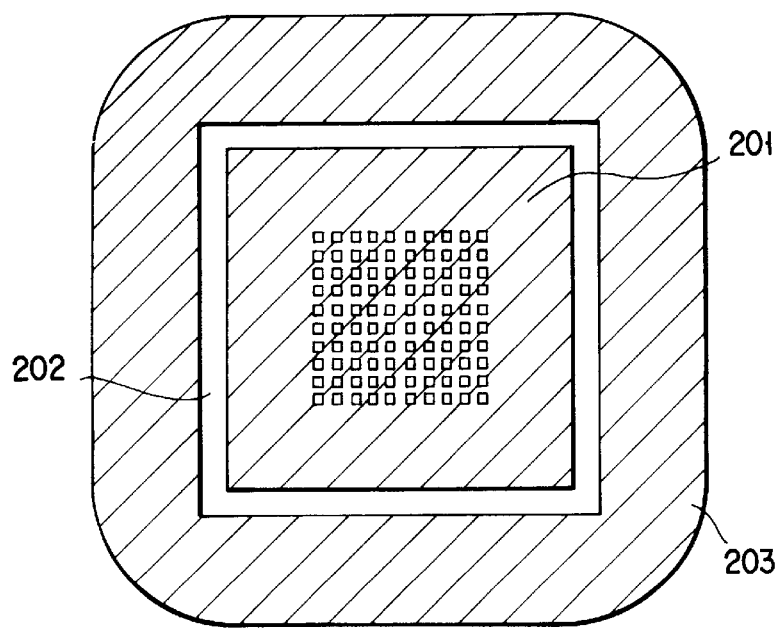
FIG. 20 is a diagram showing a transfer pattern for measurement, formed in the seventh embodiment shown in FIG. 19.

The thus obtained transfer patter is shown in FIG. 20. In this pattern, a pattern 201 which is obtained by removing the peripheral portion of the transfer pattern of the pattern 194, and a pattern 202 which is the transfer pattern of the pattern 195 are transferred on the substrate 203. With use of the transfer pattern, the aberration of the projection lens can be measured with regard to both of the directions corresponding to (X axial direction) and normal to (Y axial direction) the straight line 193 on the basis of the same principle as in the second embodiment.

It should be noted that the present invention is not limited to the embodiments described above. In these embodiment, completely linearly symmetrical patterns are employed as their patterns; however essentially it suffices only if the patterns are made such as to be linearly symmetrical with respect to a region subjected to the pattern measurement and another region which has an influence on the other region. For example, in FIG. 3, it is not necessary that the lengths of linear patterns which form a line and space pattern be all equal to each other (that is, linearly symmetrical), but it is possible that one side may be formed longer the other with respect to the line drawn therebetween.

Further, the patterns formed on the masks are not limited to those described in these embodiment, but they may be remodeled into various versions in accordance with their purpose. In short, it suffices only if a pattern obtained by removing a part of a periodic pattern having a small pitch, and a relatively large pattern are formed on a substrate such as to be linearly symmetrical to each other. Further, the exposure tool is not limited to an excimer laser exposure device or an i-ray exposure tool, but various types of exposure tool which involve the coma can be applied. Apart from the above, the present invention can be remodeled into various alternative versions as long as the essence of the invention remains.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of measuring aberration of a projection optics, comprising the steps of:

the first step of transferring a mask pattern made of periodical patterns made of a plurality of unit patterns arranged on a photomask, in a direction normal to a first straight line at an equal interval, to be substantially linearly symmetrical with respect to the first straight line, on a substrate;

the second step of transferring a trim pattern arranged on the photomask to be substantially linearly symmetrical with respect to a second straight line set in relation to the first straight line, on the substrate and superimposing the trim pattern on the mask pattern made of the transferred periodic pattern, so as to remove a predetermined number of unit patterns at a central portion of the periodic pattern, from the substrate;

the third steps of detecting a position of an outermost unit pattern out of a plurality of unit patterns of the transfer pattern formed in the first step, and a position of an innermost unit pattern out of these plurality of unit patterns of the transfer pattern, located adjacent to those removed in the second step; and the fourth step of measuring aberration of the projection optics present between the mask pattern of the photomask and the substrate, from an error in both positions, detected in the third step.

2. The aberration measurement method according to claim 1, wherein each of said plurality of unit patterns is made of one of a linear pattern and a hole pattern.

3. The aberration measurement method according to claim 1, wherein said plurality of unit patterns on the photomask are arranged at an equal distance in a direction normal to the second straight line perpendicular to the first straight line, and form a periodic pattern arranged to be substantially linearly symmetrical with respect to the second straight line.

4. A method of measuring aberration of a projection optics, comprising the steps of:

the first step of transferring a trim pattern arranged on a photomask to be substantially linearly symmetrical with respect to a second straight line set in relation to the first straight line, on a substrate, in order to remove a predetermined number of unit patterns of a central portion of a periodic pattern made of a plurality of unit patterns arranged on a photomask, in a direction normal to a first straight line at an equal interval, so as to be substantially linearly symmetrical with respect to the first straight line, on a pattern transferring substrate;

the second step of transferring a mask pattern made of a periodic pattern having a plurality of unit patterns arranged on the photomask in a direction normal to the first straight line at an equal interval and arranged to be substantially linearly symmetrical with respect to the first straight line, on the substrate and superimposing the mask pattern on the trim pattern;

the third steps of detecting a position of an outermost unit pattern out of a plurality of unit patterns of the transfer pattern formed in the second step on the trim pattern transferred in the first step, and a position of an innermost unit pattern out of these plurality of unit patterns of the transfer pattern, located adjacent to those opposing to the trim pattern removed by superimposing them on the trim pattern transferred in the first step; and the fourth step of measuring aberration of the projection optics present between the mask pattern of the photomask and the substrate, from an error in both positions, detected in the third step.

5. The aberration measurement method according to claim 4, wherein each of said plurality of unit patterns is made of one of a linear pattern and a hole pattern.

6. The aberration measurement method according to claim 4, wherein said plurality of unit patterns on the photomask are arranged at an equal distance in a direction normal to the second straight line perpendicular to the first straight line, and form a periodic pattern arranged to be substantially linearly symmetrical with respect to the second straight line.

7. A method of measuring aberration of a projection optics, comprising:

the first step of transferring on a substrate a first mask pattern having a first pattern made of a periodic pattern in which a plurality of unit patterns are arranged on a photomask in a direction normal to a first straight line at an equal interval, and which is substantially linearly symmetrical with respect to the first line, and a second pattern which is substantially linearly symmetrical with respect to the first line, and made of a pair of unit patterns having a line width larger than that of the unit patterns;

the second step of transferring on the substrate a second mask pattern made of a pair of line patterns arranged on the photomask to be substantially linearly symmetrical to a second straight line set in relation to the first straight line, and another pair of line patterns located a distant away from the other pair of line patterns, and superimposing the transferred second mask pattern on the periodic pattern of the first mask pattern and the pair of unit patterns having a larger line width, in order to leave a predetermined number of unit patterns of the periodic pattern which is the first pattern and all of the pair of unit patterns having a larger line width, which is the second pattern;

the third step of detecting a value of a difference between a center position of a pair of edge signal waveforms obtained to correspond to a position of the pair of line patterns left as being superimposed in the second step, and a center position of a pair of edge signal waveforms obtained to correspond to a position of the other pair of line patterns; and the fourth step of measuring the aberration of the projection optics, which is situated between the mask pattern of the photomask and the substrate, from the value of the difference detected in the third step.

8. An aberration measuring method according to claim 7, wherein said plurality of unit patterns are made of one of linear patterns and hole patterns.

9. An aberration measuring method according to claim 7, wherein said plurality of unit patterns on the photomask are arranged in a direction normal to the second straight line which is normal to the first straight line at an equal interval, and forms a periodic pattern arranged to be substantially linearly symmetrical with respect to the second straight line.

10. A method of measuring aberration of a projection optics, comprising:

the first step of transferring, on a substrate, a first mask pattern made of a pair of line patterns arranged on the photomask to be substantially linearly symmetrical to a second straight line corresponding to the first straight line, and another pair of line patterns located a distant away from the other pair of line patterns, in order to leave, on a substrate for transfer, a predetermined number of unit patterns of the periodic pattern which is the first pattern and all of the pair of unit patterns, which is the second pattern, which constitute the first mask pattern;

the second step of transferring, on the substrate, a second mask pattern having a first pattern made of a periodic pattern in which a plurality of unit patterns are arranged on a photomask in a direction normal to a first straight line at an equal interval, and which is substantially linearly symmetrical with respect to the first line, and a second pattern which is substantially linearly symmetrical with respect to the first line, and made of a pair of unit patterns having a line width larger than that of the unit patterns, and superimposing the second mask pattern on the first mask pattern made of the pair of line patterns and the other pair of line patterns located a distant away from the pair of line patterns;

the third step of detecting a value of a difference between a center position of a pair of edge signal waveforms obtained to correspond to a position of the pair of line patterns left as being superimposed in the second step, and a center position of a pair of edge signal waveforms obtained to correspond to a position of the other pair of line patterns; and the fourth step of measuring the aberration of the projection optics, which is situated between the mask pattern of the photomask and the substrate, from the value of the difference detected in the third step.

11. An aberration measuring method according to claim 10, wherein said plurality of unit patterns are made of one of linear patterns and hole patterns.

12. An aberration measuring method according to claim 10, wherein said plurality of unit patterns on the photomask are arranged in a direction normal to the second straight line which is normal to the first straight line at an equal interval, and forms a periodic pattern arranged to be substantially linearly symmetrical with respect to the second straight line.

13. A method of measuring aberration of a projection optics, comprising:

the first step of transferring, on a substrate, a mask pattern made of a periodic pattern in which a plurality of unit patterns are arranged on a photomask in a direction normal to a first straight line at an equal interval, and which is substantially linearly symmetrical with respect to the first line;

the second step of transferring, on the substrate, a trim pattern arranged on the photomask to be substantially linearly symmetrical to a second straight line corresponding to the first straight line, in order to remove a predetermined number of unit pattern of the periodic pattern and to form an opening edge, and superimposing the transferred trim pattern on the mask pattern made of the transferred periodic pattern;

the third step of detecting a position of the opening edge of the transfer pattern formed in the second step, and a position of an innermost unit pattern of those of said plurality of unit patterns of the transfer pattern formed in the first step, which are located adjacent to those opposing to the trim pattern, removed as being superimposed in the second step; and the fourth step of measuring the aberration of the projection optics, which is situated between the mask pattern of the photomask and the substrate, from a difference between both positions detected in the third step.

14. An aberration measuring method according to claim 13, wherein said plurality of unit patterns are made of one of linear patterns and trim patterns.

15. An aberration measuring method according to claim 13, wherein said plurality of unit patterns on the photomask are arranged in a direction normal to the second straight line which is normal to the first straight line at an equal interval, and forms a periodic pattern arranged to be substantially linearly symmetrical with respect to the second straight line.

16. A method of measuring aberration of a projection optics, comprising:

the first step of transferring, on a substrate, a trim pattern arranged on the photomask to be substantially linearly symmetrical to a second straight line corresponding to a first straight line, in order to remove a predetermined number of unit pattern of the periodic pattern and to form an opening edge;

the second step of transferring, on the substrate, a mask pattern made of a periodic pattern in which a plurality of unit patterns are arranged on a photomask in a direction normal to the first straight line at an equal interval, and which is substantially linearly symmetrical with respect to the first line, and superimposing the mask pattern on the transferred trim pattern;

the third step of detecting a position of the opening edge of the transfer pattern formed in the second step, and a position of an innermost unit pattern of those of said plurality of unit patterns of the transfer pattern formed in the first step, which are located adjacent to those opposing to the trim pattern, removed as being superimposed in the second step; and the fourth step of measuring the aberration of the projection optics, which is situated between the mask pattern of the photomask and the substrate, from a difference between both positions detected in the third step.

17. An aberration measuring method according to claim 16, wherein said plurality of unit patterns are made of one of linear patterns and trim patterns.

18. An aberration measuring method according to claim 16, wherein said plurality of unit patterns on the photomask are arranged in a direction normal to the second straight line which is normal to the first straight line at an equal interval, and forms a periodic pattern arranged to be substantially linearly symmetrical with respect to the second straight line.

19. A method of measuring aberration of a projection optics, comprising:

the first step of transferring, on a substrate, a mask pattern having a first pattern made of a Y directional line and space in which a plurality of linear patterns are arranged in a Y axial direction normal to an X axial direction at an equal interval, to be linearly symmetrical with respect to the X axial direction, and an X directional line and space in which a plurality of linear patterns are arranged in an X axial direction normal to the Y axial direction at an equal interval, so as to be linearly symmetrical with respect to the Y axial direction, and a second pattern made of a Y directional line having a line width larger than that of the linear pattern, and arranged to be linearly symmetrical with respect to the X axis, and an X directional line having a line width larger than that of the linear pattern and arranged to be linearly symmetrical with respect to the Y axis;

the second step of transferring, on the substrate, a trim pattern, and superimposing the transferred trim pattern on the mask pattern having the first and second patterns, in order to remove a predetermined number of line patterns in a central portion and a peripheral portion of the first pattern on the mask pattern in symmetrical manner with respect to the X axis and Y axis;

the third step of detecting a position in terms of the X axial direction and the Y axial direction, of the transfer pattern of the second pattern formed in the first step, and a position in terms of the X axial direction and Y axial direction, of those line pattern of the transfer pattern of the first pattern formed in the first step, which remain without being removed in the second step; and the fourth step of measuring the aberration of the projection optics, which is situated between the mask pattern of the photomask and the substrate, from the difference in the both positions detected in the third step.

* * * * *

UNITED STATES PATENT AND TRADEMARK OFFICE
CERTIFICATE OF CORRECTION

PATENT NO.   : 6,011,611
DATED        : January 4, 2000
INVENTORS    : Hiroshi NOMURA et al.

It is certified that error appears in the above-identified patent and that said Letters Patent is hereby corrected as shown below:

Title Page, Item [57], in the Abstract, line 9, "patter" should read --pattern--.

Claim 7, Column 17, line 11, "distant" should read --distance--.

Claim 10, Column 17, line 46, "distant" should read --distance--.

Claim 10, Column 17, line 65, "distant" should read --distance--.

Claim 13, Column 18, line 31, "unit pattern" should read --unit patterns--.

Claim 16, Column 18, line 62, "unit pattern" should read --unit patterns--.

*Claim 19, Column 19, line 30, after "interval,", insert --so as--.

Claim 19, Column 20, line 24, "those line pattern" should read --those line patterns--.

Signed and Sealed this

Third Day of April, 2001

*Attest:*

NICHOLAS P. GODICI

*Attesting Officer*   Acting Director of the United States Patent and Trademark Office